United States Patent [19]

Elbert

[11] Patent Number: 4,939,519
[45] Date of Patent: Jul. 3, 1990

[54] APPARATUS FOR METHOD AND A HIGH PRECISION ANALOG-TO-DIGITAL CONVERTER

[75] Inventor: Hubert F. Elbert, Tucson, Ariz.
[73] Assignee: Thaler Corporation, Tucson, Ariz.
[21] Appl. No.: 825,566
[22] Filed: Feb. 3, 1986
[51] Int. Cl.⁵ .......................................... H03M 1/50
[52] U.S. Cl. ................................. 341/167; 341/119; 341/166; 320/1
[58] Field of Search ................. 340/347 NT, 347 AD; 320/1; 341/118, 119, 127, 128, 155, 166, 167, 169

[56] References Cited

U.S. PATENT DOCUMENTS

| | | | |
|---|---|---|---|
| 3,918,050 | 11/1975 | Dorsman | 340/347 NT |
| 4,075,623 | 2/1978 | Futagawa et al. | 340/347 NT |
| 4,195,235 | 3/1980 | Schoeff | 340/347 NT |
| 4,320,390 | 3/1982 | Scott | 340/347 NT |
| 4,379,260 | 4/1983 | Labus | 340/347 NT |
| 4,588,984 | 5/1986 | Dorsman | 340/347 NT |

FOREIGN PATENT DOCUMENTS 1400565  7/1975  United Kingdom ................. 341/128

Primary Examiner—William M. Shoop, Jr.
Assistant Examiner—Brian K. Young
Attorney, Agent, or Firm—Cates, Phillips, & Holloway

[57] ABSTRACT

An analog-to-digital converter includes a constant current source that alternately charges and discharges the capacitor between predetermined levels. The difference between the rate of charging and the rate of discharging of the capacitor provide information permitting a digital representation of the input signal. The single current source operates without change during the charging and discharging of the capacitor and has temperature compensation that eliminates potential errors due to instabilities in the ambient temperature.

11 Claims, 2 Drawing Sheets

APPARATUS FOR METHOD AND A HIGH PRECISION ANALOG-TO-DIGITAL CONVERTER

BACKGROUND OF THE INVENTION

1. Field of the Invention

This invention relates generally to analog-to-digital converters and, more particularly, to analog-to-digital converters that are to be used in applications requiring a high degree of accuracy.

2. Description of the Related Art

In order to achieve high accuracy in the analog-to-digital conversion of a signal, the use of the standard successive approximation technique has proven to be inadequate. As the additional elements are added for improving the accuracy of the measurement, the errors become cumulative and provide a limit on the accuracy of the components of the system that can not be overcome without excessive effort. Therefore, a somewhat different technique has been used in high precision measurements of the signal. The method consists of providing two slopes, for example, charging and discharging a capacitor, on which the input signal acts. The input signal determines the difference in the two measurements. Therefore, because the relationship of the slopes of the charging current depend on the input signal, the times to reach a predetermined upper and return to a predetermined lower level can be used to provide an accurate measurement of the input signal. This technique is shown in FIG. 1. The T1 time indicates the time, for example, for charging a reference capacitor while the T2 time determines the time for discharging the reference capacitor. A constant frequency signal source can be counted during the charging and discharging periods to determine the effect of the input signal.

While this technique has proven to be effective in determining with precision the value of an input signal, the limitation on the accuracy results from the use of separate apparatus for charging the capacitor and for discharging the capacitor. This difference in apparatus has provided a problem in matching components that has proven to provide an upper limit on the accuracy available by this technique in determining a value for an input signal.

A need has therefore been felt for apparatus that permits positive and a negative slope measurement of high precision using a common capacitor charging and discharging circuit. This apparatus can be used as a precision digital measuring circuit. In addition, because of the problems associated with temperature dependence of components, and particularly the semiconductor components, a need has also been felt to provide temperature stability for the charging and discharging circuit.

SUMMARY OF THE INVENTION

It is therefore an object of the present invention to provide an improved analog-to-digital converter.

It is another object of the present invention to provide an analog-to-digital converter utilizing the difference in the slopes of charging and discharging a capacitor to determine the value of an input signal.

It is yet another object of the present invention to provide an improved analog-to-digital converter by providing a single activation source for achieving the negative and positive slope in the measurement of differences of capacitor charging cycles resulting from the presence of an input signal.

It is yet a more particular object of the present invention to provide an improved analog-to-digital converter that provides a single activation source for charging and discharging a capacitor, the difference in the charging and discharging time being related to the value of that input signal.

It is yet another more particular object of the present invention to provide a single temperature compensated activation source for charging and discharging a capacitor, the difference in the capacitor charging and discharging rate being proportional to an input signal.

The aforementioned and other objects are accomplished, according to the present invention, by a current source that charges the capacitor until a first voltage level is achieved and then discharges that capacitor until a second voltage level is achieved. The period of the charging and the period of the discharging of the capacitor are measured relative to a clock source and the difference between the charging and discharging values can provide a value for the input signal. The clock signals measure the time to reach the limits of the voltage in charging and discharging the capacitor. The signal measurements are provided to a microprocessor that processes the signals and provides a value for the input signal.

These and other features of the present invention will be understood upon reading of the following description along with the drawings.

DESCRIPTION OF THE PREFERRED EMBODIMENT

Detailed Description of the Figures

Figure 1:
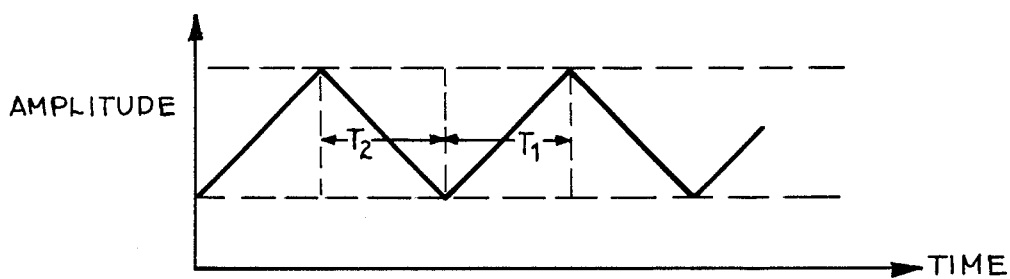
FIG. 1 is a diagram of the technique used in determining a digital value related to an analog input signal.

Referring now to FIG. 1, the amplitude of the voltage across the capacitor as a function of time is shown. The amplitude of the voltage across the capacitor will rise until a first predetermined level is reached, and then the capacitor will discharge causing a following voltage until a second predetermined level is reached. Then the cycle will be repeated. $T_2$ is the period of time measuring the discharging time between the two predetermined levels and $T_1$ is the period of time measuring the charging time between the two levels.

Figure 2:
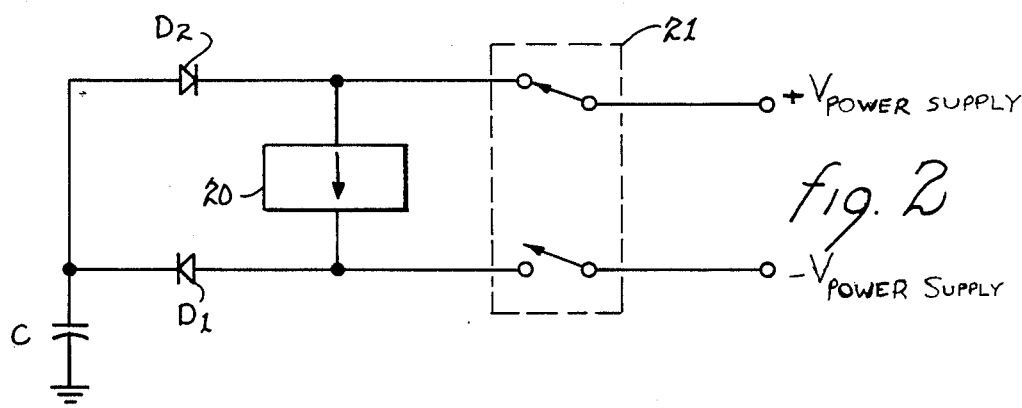
FIG. 2 is a block diagram of the circuit according to the present invention used to implement the technique shown in FIG. 1.

Referring next to FIG. 2, a capacitor C has a first terminal coupled to ground and a second terminal coupled to both a cathode terminal of diode D2 and an anode terminal of diode D2. The anode terminal of diode D1 is coupled to one terminal of current source 20 and to a switch 21 that can couple the terminal to the negative reference voltage $-V_{REF}$. The cathode terminal of diode D2 is coupled to a second terminal of current source 20 and to a second set of terminals associated with switch 21 that can couple the terminal to reference voltage $+V_{REF}$. Switch 21 is arranged so that either voltage reference $+V_{REF}$ or reference voltage $-V_{REF}$ is coupled to the associated terminal but not both simultaneously.

Figure 3:
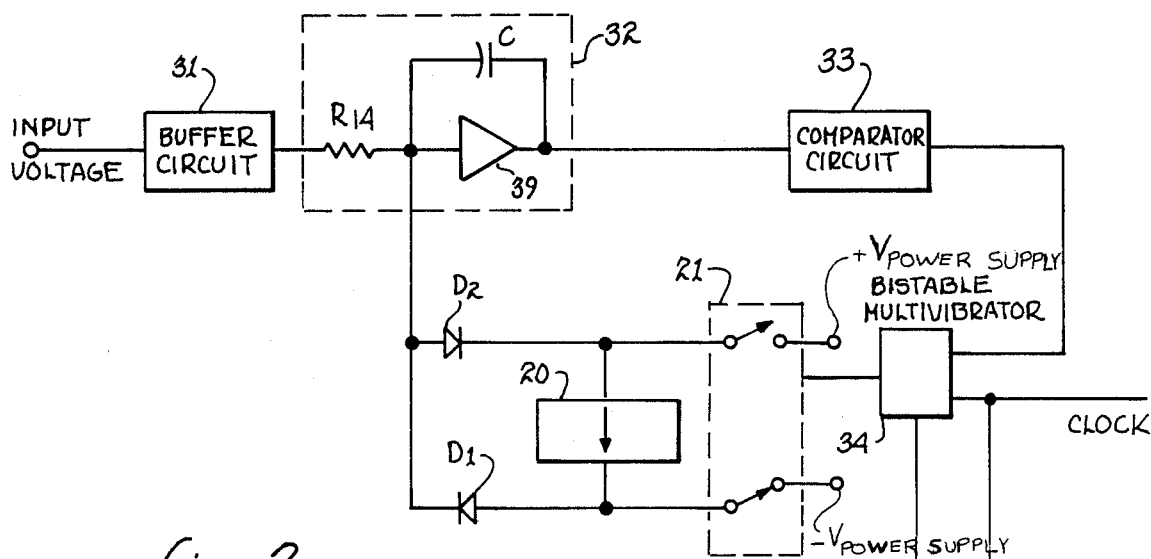
FIG. 3 is a expanded block diagram of the circuit used by the present invention to provide a digital signal related to the amplitude of an input signal.

Referring next to FIG. 3, a block diagram of the circuit according to the instant invention is shown. The input voltage is the voltage for which a digital signal equivalent is desired. The input voltage is applied to an input terminal of buffer circuit 31 while the output terminal of buffer circuit 31 is coupled to one terminal of R14. The second terminal of R14 is coupled to an input terminal of operational amplifier 39 and is coupled through capacitor C to an output terminal of operational amplifier 39 and is coupled to a anode terminal of diode D2 and to a cathode terminal of diode D1. The output terminal of operational amplifier 39 is coupled to comparator circuit 33 while the output terminal of comparator circuit 33 is coupled to an input terminal of bistable multivibrator circuit 34. The multivibrator circuit 34 also has a clock signal input. One output terminal of bistable multivibrator 34 controls the switch 21. A cathode terminal of diode D2 is coupled to a first terminal of current source 20 and to a first terminal of switch 21. When switch 21 is in an appropriate position, then the current source 20 is coupled to $+V_{REF}$. The anode terminal of diode D1 is coupled to a second terminal of current source 20 and to a second input terminal of switch 21. When the switch 21 is in the appropriate position, then the second terminal of current source 20 is coupled to $-V_{REF}$. A second output terminal of bistable multivibrator 34 and clock signals are coupled to input terminals of counter 35. Counter 35 is coupled to a latch circuit 36 and the latch circuit is in turn coupled to the microprocessor 37.

Figure 4:
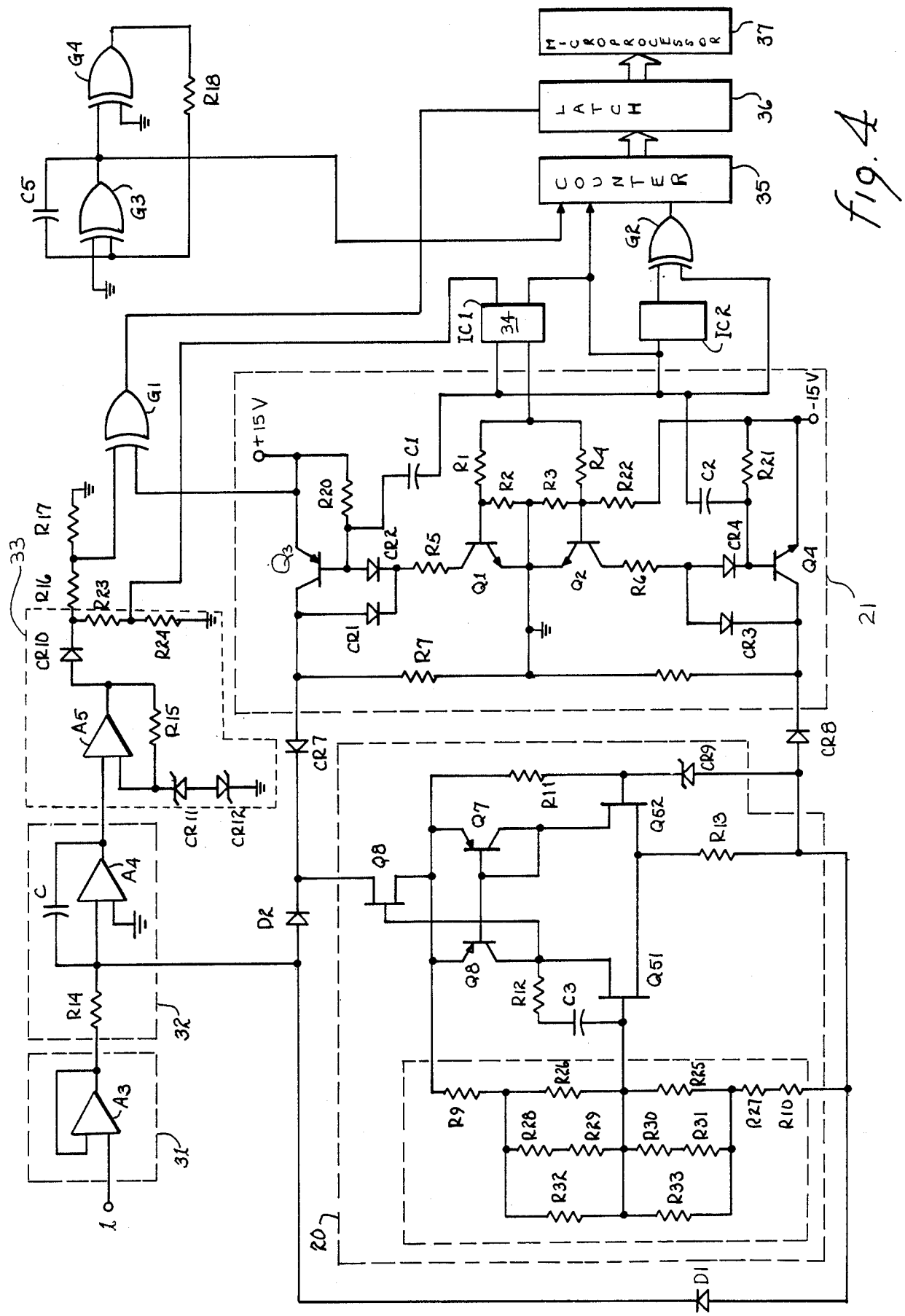
FIG. 4 is a circuit diagram of the circuit used to implement the measurement of a digital output signal derived from an analog input signal.

Referring next to FIG. 4, a detailed circuit diagram of the analog-to-digital converter of the present invention is shown. Terminal 1, to which an input signal is applied, is coupled to a first terminal of operational amplifier A3. A second terminal of operation amplifier A3 is coupled to the output terminal of operational amplifier A3 and to a first terminal of resistance R14. A second terminal of resistance R14 is coupled to an input terminal of operational amplifier A4, is coupled through capacitor C to an output terminal of operational amplifier A4, is coupled to an anode terminal of diode D2 and is coupled to a cathode terminal of D1. A second input terminal of operational amplifier A4 is coupled to the ground potential. The output terminal of operational amplifier A4 is coupled to an input terminal of operational amplifier A5. A second input terminal of operational amplifier A5 is coupled through resistor R15 to an output terminal of operational amplifier A5 and to a cathode terminal of zener diode CR11. The anode terminal of diode CR11 is coupled to an anode terminal of zener diode CR12 while the cathode terminal of zener diode CR12 is coupled to ground potential. The output terminal of operational amplifier A5 is coupled to an anode terminal of diode CR10 while a cathode terminal of diode CR10 is coupled to a first terminal of resistor R16 and to a first terminal of R23. A second terminal of resistor R16 is coupled through resistor R17 to the ground potential and is coupled to a first input terminal of exclusive OR gate G1. A second terminal of resistor R23 is coupled through resistor R24 to the ground potential and is coupled to a terminal of IC1. An anode terminal of D1 is coupled to a first terminal of resistor R10, to a first terminal of resistor R13, to a anode terminal of zener diode CR9 and to an anode terminal of diode CR8. A second terminal of resistor R10 is coupled to a first terminal of resistor R27. A second terminal of resistor R27 is coupled to a first terminal of resistor R25, is coupled to a first terminal of R31, and is coupled to a first terminal of resistor R33. A second terminal of resistor R31 is coupled to a first terminal of resistor R30. A second terminal of R33 is coupled to a first terminal of R32, to a first terminal of R29, to a second terminal of R30, to a second terminal of R25, to a first terminal of resistor R26, to a first terminal of capacitor C3, and to a gate terminal of transistor Q51. A second terminal of resistor R29 is coupled to a first terminal of R28. A second terminal of resistor R32 is coupled to a second terminal of R28, to a second terminal of R26, and to a first terminal of R9. A second terminal of R9 is coupled to a emitter terminal of PNP transistor Q8, to a source terminal of transistor Q8, to an emitter terminal of PNP transistor Q7, and to a first terminal of resistor R11. A collector terminal of transistor Q8 is coupled to a drain terminal of transistor 51, to a gate terminal of transistor Q8 and through resistor R12 to a second terminal of capacitor C3. A source terminal with transistor Q51 is coupled to a second terminal of resistor R13 and to a source terminal Q52. A gate terminal of transistor Q8 is coupled to a gate terminal of transistor Q7, to a collector terminal of transistor Q7, and to a drain terminal of transistor Q52. A gate terminal of transistor Q52 is coupled to a cathode terminal of zener diode CR9 and to a second terminal of resistor R11. A cathode terminal of diode D2 is coupled to a drain terminal of transistor Q8 and to a cathode terminal of diode CR7. An anode terminal of diode CR7 is coupled to a first terminal of resistor R7 to an anode terminal of diode CR1 and to a collector terminal of PNP transistor Q3. An emitter terminal of PNP transistor Q3 is coupled to a 15 volt supply terminal, to a second input terminal of exclusive OR gate G1, and to a first terminal of resistor R20. A second terminal of resistor R20 is coupled to a base terminal of transistor Q3, to a first terminal of capacitor C1, and to a anode terminal of diode CR2. A cathode terminal of diode CR1 is coupled to a first terminal of resistor R5 and to a cathode terminal of diode CR2. A second terminal of resistor R5 is coupled to a collector terminal of NPN transistor Q1. An emitter terminal of transistor Q1 is coupled to ground potential, is coupled to an emitter terminal of PNP transistor Q2, to a first terminal of resistor R8 and to a second terminal of resistor R1. A cathode terminal of diode CR8 is coupled to a second terminal of R8 to a cathode terminal of diode CR3 and to a collector terminal of NPN transistor Q4. An emitter of transistor Q2 is coupled to a first terminal of resistor R6, while a second terminal of resistor R6 is coupled to a cathode terminal of diode CR4 and to a cathode diode of CR3. A cathode terminal of diode CR4 is coupled to a base terminal of transistor Q4 to a first terminal of capacitor C2 and to a first terminal of resistor R21. The emitter terminal of transistor Q4 is coupled to the negative potential, to a second terminal of R21 and to a first terminal of R22. The base terminal of transistor Q2 is coupled to a first terminal of resistor R3 and to a first terminal of resistor R4 and to a first terminal of resistor R22. The base terminal of transistor Q1 is coupled to a first terminal of resistor R2 and to a first terminal of resistor R1. A second terminal of resistor R4 and a second terminal of resistor R1 are coupled to integrated multivibrator circuit IC1. A second terminal of capacitor C2 is coupled to a second terminal of capacitor C1, to an input terminal of IC1 and to an input terminal of integrated circuit IC1 and to a first counter terminal, an output terminal of IC1 is coupled to the counter input terminal and an output terminal of exclusive OR gate is coupled to the counter. A first input terminal of exclusive OR gate G2 is coupled to an output terminal of integrated multivibrator circuit IC2. A third input terminal of counter 41 is coupled to an output terminal of exclusive OR gate G3 and to a first input terminal of exclusive OR gate G4. A first input terminal of exclusive OR gate G3 is coupled to the ground potential, while a second input terminal of exclusive OR gate G5 is coupled through capacitor C5 to the output terminal of exclusive OR gate G3 and through resistor R18 to an output terminal of exclusive OR gate G4. A second input terminal of exclusive OR gate G4, is coupled to the ground potential.

Operation of the Preferred Embodiment

The input signal is applied to terminal 1 and consequently through buffer circuit 31 to an integrating circuit 32. The integrating circuit 32 has the capacitor which is charged and discharged at a rate determined by the input signal. The use of the capacitor in the integrating circuit increases the linearity of the slope of the output voltage as the capacitor is charged and discharged. The reference voltages provided by Zener diodes CR11 and CR12 are the voltage levels used by the comparator 33 which determine at what voltage output levels of integrating circuit 32 the state of switch 21 is changed. The current source 20 charges the capacitor C through diode D1 and discharges the capacitor C through diode D2 depending on the state of switch 21. The buffer circuit 31 provides a voltage level to the input terminal of circuit 32 that causes the difference in the slopes of the output voltage of the integrating circuit 32 during the charging and discharging of capacitor C. The network 20 of FIG. 4 is the preferred embodiment implementation of the single current source 20 shown in FIG. 2 and FIG. 3 that charges and discharges capacitor C. The resistance network is comprised of several resistors and thermistors appropriately adjusted to provide temperature compensation for the Zener diode CR9 used as a reference for the current source. Referring to the resistor network of FIG. 4 including resistors R9, R10 and R25-R33, by replacing selected resistors with thermistors and variable resistors (e.g., trimmable resistive elements), compensation for the temperature dependence of the constant current source 20 can be provided. This technique is described in U.S. Pat. No. 4,668,903 entitled APPARATUS AND METHOD FOR A TEMPERATURE COMPENSATED REFERENCE VOLTAGE SUPPLY, invented by Hubert F. Elbert, issued on May 27, 1987 and assigned to the assignee of the present invention. The state of switch 21 is determined by the state of bistable multivibrator 34 and which has two leads coupled to switch 21. The state of bistable multivibrator 34 is determined by the state of comparator 33, the state of the comparator being determined by whether capacitor C is being charged or discharged. One terminal of bistable multivibrator 34 is coupled to the enable terminal of counter 35, enabling the counter 35 to count (clock) pulses from the oscillator comprised of exclusive OR gates G3 and G5 and associated elements. The clock counts stored in counter 35 identify the duration of the activation signal from bistable multivibrator 34. The multivibrator IC2 and exclusive OR gate G2 provide the reset signals for the counter 35. The clock count in counter 35 is transferred to latch 36 when switch 21 changes state by means of a signal from the exclusive OR gate G1. Latch 36 then applies the clock count to the microprocessor 37. The microprocessor 37 can compare the clock count from counter 35 determined during a charging of capacitor C with the clock count from counter 35 determined during a discharge of capacitor C. The comparison can provide a quantity that is related to the magnitude of the input signal, i.e., because the charging and discharging current for capacitor C are equal by definition of a current source, then the difference in the rates of charging and discharging capacitor C (and hence the slope of the integrating circuit 32 output voltage) is the result of current flowing into or from capacitor C from the buffer circuit 31. This current flowing to or from the buffer circuit 31 is proportional to the input signal. As will be clear, the use of clock signals from an internal oscillator will require calibration.

The foregoing description is included to illustrate the operation of the preferred embodiment and is not meant to limit the scope of the invention. The scope of the invention is to be limited only by the following claims. From the foregoing description, many variations will be apparent to one skilled in the art that would yet be encompassed by the spirit and scope of the present invention.

What is claimed is:

1. Apparatus for controllably charging and discharging a capacitor comprising;
    capacitor means including a reference capacitor, said reference capacitor having a first terminal coupled to a reference potential;
    a first diode having a cathode terminal coupled to a second terminal of said reference capacitor;
    a second diode having an anode terminal coupled to said reference capacitor second terminal;
    a current source having a current input terminal coupled to a cathode terminal of said second diode and a current output terminal coupled to an anode terminal of said first diode; and
    switching means coupled to said current source, said switching means applying a first potential to said current source input terminal for charging said reference capacitor in a first switching means mode, said switching means applying a second potential to said current source output terminal for discharging said reference capacitor in a second switching means mode.

2. The capacitor charging and discharging apparatus of claim 1 wherein a rate of charging said reference capacitor and a rate of discharging said reference capacitor is determined by an input signal applied to said second reference capacitor terminal.

3. Apparatus for controllably charging and discharging a capacitor, said apparatus comprising:
    capacitor means including a reference capacitor, said reference capacitor having a first terminal coupled to a reference potential;
    a first diode having a cathode terminal coupled to a second terminal of said reference capacitor;
    a second diode having an anode terminal coupled to said reference capacitor second terminal
    current source means having a current input terminal coupled to a cathode terminal of said second diode and a current output terminal coupled to an anode terminal of said first diode; and switching means coupled to said current source means, said switching means applying a first potential to said current source input terminal for charging said reference capacitor in a first switching means mode, said switching means applying a second potential to said current source output terminal for discharging said reference capacitor in a second switching means mode, wherein a rate of charging said reference capacitor and a rate of discharging said reference capacitor is determined by an input signal applied to said second reference capacitor terminal, wherein said current source means has power supplied thereto by a difference in potential between said second capacitor terminal and said second potential in said second switching means mode and a difference in potential between said first potential and said second capacitor terminal in said first switching means mode.

4. The capacitor charging and discharging apparatus of claim 3 further including comparison means responsive to a second capacitor terminal potential and coupled to said switching means for establishing said first or said second switching means mode.

5. The capacitor charging and discharging apparatus of claim 4 wherein said current source means includes a temperature-compensation network.

6. The capacitor charging and discharging apparatus of claim 4 wherein said capacitor means includes an integrating circuit, said reference capacitor being an integrating capacitor with respect to said integrating circuit.

7. The capacitor charging and discharging apparatus of claim 6 further including timing means for measuring a discharging time and a charging time for said reference capacitor.

8. The capacitor charging and discharging apparatus of claim 7 further including processing means for comparing said charging and discharging times, said comparing providing a value proportional to said input signal.

9. The capacitor charging and discharging apparatus of claim 2 further comprising a resistor having a first terminal coupled to said second reference capacitor terminal, wherein said input signal is applied to a second terminal of said resistor.

10. The capacitor charging and discharging apparatus of claim 3 further comprising a resistor having a first terminal coupled to said second reference capacitor terminal, wherein said input signal is applied to a second terminal of said resistor.

11. The capacitor charging and discharging apparatus of claim 6 further comprising a resistor having a first terminal coupled to said second reference capacitor terminal, wherein said input signal is applied to a second terminal of said resistor.

* * * * *